(12) United States Patent
Luo et al.

(10) Patent No.: US 11,270,635 B2
(45) Date of Patent: Mar. 8, 2022

(54) DISPLAY DEVICE AND DISPLAY MODULE

(71) Applicants: Chengdu BOE Optoelectronics Technology Co., Ltd., Sichuan (CN); BOE Technology Group Co., Ltd., Beijing (CN)

(72) Inventors: Yonghui Luo, Beijing (CN); Binfeng Feng, Beijing (CN); Jiaxiang Wang, Beijing (CN); Yupeng Chen, Beijing (CN); Chao Wang, Beijing (CN); Fei Li, Beijing (CN); Zijie Zhang, Beijing (CN); Hailong Ran, Beijing (CN)

(73) Assignees: CHENGDU BOE OPTOELECTRONICS TECHNOLOGY CO., LTD., Sichaun (CN); BOE TECHNOLOGY GROUP CO., LTD., Beijing (CN)

( * ) Notice: Subject to any disclaimer, the term of this patent is extended or adjusted under 35 U.S.C. 154(b) by 87 days.

(21) Appl. No.: 16/771,252

(22) PCT Filed: Jul. 30, 2019

(86) PCT No.: PCT/CN2019/098337
§ 371 (c)(1),
(2) Date: Jun. 10, 2020

(87) PCT Pub. No.: WO2021/016848
PCT Pub. Date: Feb. 4, 2021

(65) Prior Publication Data
US 2021/0407389 A1    Dec. 30, 2021

(51) Int. Cl.
*G09G 3/3208* (2016.01)

(52) U.S. Cl.
CPC ....... *G09G 3/3208* (2013.01); *G09G 2330/06* (2013.01)

(58) Field of Classification Search
CPC .................... G09G 3/3208; G09G 2330/06
See application file for complete search history.

(56) References Cited

U.S. PATENT DOCUMENTS

2014/0002345 A1    1/2014   Shakya et al.
2019/0165332 A1*   5/2019   Kwon ................... H01L 51/525

FOREIGN PATENT DOCUMENTS

| CN | 105824460 A | 8/2016 |
| CN | 106252380 A | 12/2016 |
| CN | 107454215 A | 12/2017 |

OTHER PUBLICATIONS

International search report of PCT application No. PCT/CN2019/098337 dated Apr. 15, 2020.

* cited by examiner

*Primary Examiner* — Stacy Khoo
(74) *Attorney, Agent, or Firm* — Fay Sharpe LLP

(57) ABSTRACT

A display device includes a display module and a middle frame antenna. The display module includes a display panel, a wave-absorbing layer, a driving circuit and a flexible circuit board. An orthographic projection of the driving circuit on a first panel part, an orthographic projection of the flexible circuit board on the first panel part, and an orthographic projection of the wave-absorbing layer on the first panel part do not overlap.

20 Claims, 5 Drawing Sheets

DISPLAY DEVICE AND DISPLAY MODULE

CROSS-REFERENCE TO RELATED APPLICATION

This application is a 371 of PCT Application No. PCT/CN2019/098337, filed on Jul. 30, 2019, the entire contents of which are incorporated herein by reference.

TECHNICAL FIELD

The present disclosure relates to the field of display technologies, and in particular, to a display device and a display module.

BACKGROUND

With the development of display technologies, display devices such as mobile phones gradually develop towards full-screen display devices. A full-screen display device has a compact structure, a high screen-to-body ratio and a narrow frame.

The inventor knows that in the full-screen display device, generally, a display integrated circuit (IC) of a display panel is connected with a signal line in a display panel with a multiplexer (MUX) so as to reduce an area of a wiring region of the display panel and thus achieve the high screen-to-body ratio and frame narrowing of the display device.

SUMMARY

In one aspect, a display device is provided. The display device includes:
a display module and a middle frame antenna located around the display module, wherein
the display module includes:
a display panel wherein the display panel includes a first panel part, a second panel part, and a bent panel part connecting the first panel part and the second panel part, and the second panel part is located on a back surface of the first panel part;
a wave-absorbing layer, wherein the wave-absorbing layer is located between the first panel part and the second panel part, and a minimum distance between a boundary of the wave-absorbing layer and the middle frame antenna is greater than or equal to 8 millimeters;
a driving circuit located on a side, away from the first panel part, of the second panel part and electrically connected with the display panel; and
a flexible circuit board located on the back surface of the first panel part and electrically connected with an end, away from the bent panel part, of the second panel part, wherein
an orthographic projection of the driving circuit on the first panel part, an orthographic projection of the flexible circuit board on the first panel part and an orthographic projection of the wave-absorbing layer on the first panel part do not overlap.

In another aspect, a display module is provided. The display module includes:
a display panel including a first panel part, a second panel part, and a bent part connecting the first panel part and the second panel part, wherein the second panel part is located on a back surface of the first panel part;
a driving circuit, wherein the driving circuit includes a multiplexer and a display integrated circuit, both the multiplexer and the display integrated circuit are located on a surface, away from the first panel part, of the second panel part, and the display integrated circuit is electrically connected with the display panel through the multiplexer;
a flexible circuit board, wherein the flexible circuit board is located on a back surface of the first panel part and one end of the flexible circuit board is electrically connected with an end, away from the bent panel part, of the second panel part and the other end is configured to be electrically connected with a client mainboard; and
a shielding film, wherein the shielding film includes an adhesive layer and a shielding layer which are stacked, the shielding film is adhered to a side, away from the first panel part, of the driving circuit through the adhesive layer, and an orthographic projection of the shielding film on the first panel part covers an orthographic projection of the driving circuit on the first panel part and an orthographic projection of the flexible circuit board on the first panel part, wherein
the flexible circuit board includes a conductive layer and an insulating layer which are stacked, the insulating layer has an opening, part of the conductive layer is exposed through the opening, the adhesive layer includes a conductive portion and an insulating portion, an orthographic projection of the conductive layer on the first panel part overlapping with an orthographic projection of the opening on the first panel part, and the shielding film is grounded.

BRIEF DESCRIPTION OF THE DRAWINGS

In order to describe the technical solutions in the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

For clearer descriptions of the objects, technical solutions and advantages in the embodiments of the present disclosure, the present disclosure is described in detail below in combination with the accompanying drawings. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

Figure 1:
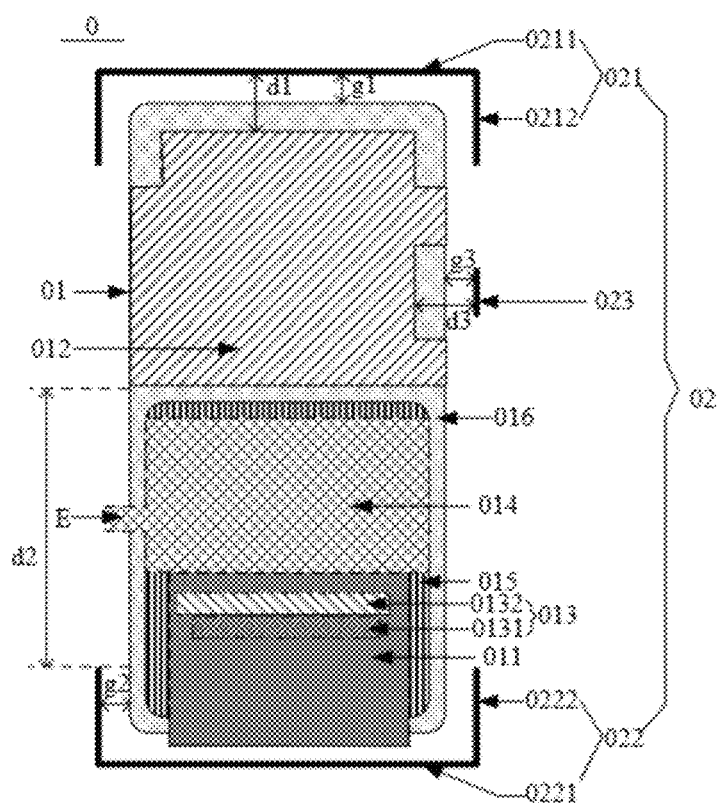
FIG. 1 is a front view structural schematic diagram of a display device according to an embodiment of the present disclosure.

FIG. 1 is a front view structural schematic diagram of a display device 0 according to an embodiment of the present disclosure. Please refer to FIG. 1, the display device 0 includes a display module 01 and a middle frame antenna 02 located around the display module 01. The display module 01 includes a display panel 011, a wave-absorbing layer 012, a driving circuit 013 and a flexible circuit board 014.

Figure 2:
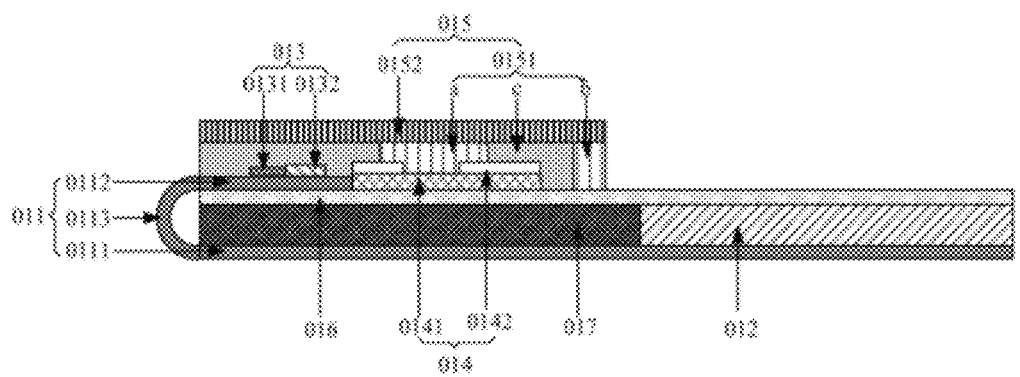
FIG. 2 is a sectional view structural schematic diagram of a display module according to an embodiment of the present disclosure.

FIG. 2 is a sectional view structural schematic diagram of the display module 01 according to the embodiment of the present disclosure. Please refer to FIG. 2, the display panel 011 includes a first panel part 0111, a second panel part 0112, and a bent panel part 0113 connecting the first panel part 0111 and the second panel part 0112. The second panel part 0112 is located on a back surface of the first panel part 0111. The wave-absorbing layer 012 is located between the first panel part 0111 and the second panel part 0112 and the minimum distance between the boundary of the wave-absorbing layer 012 and the middle frame antenna 02 is greater than or equal to 8 millimeters. The driving circuit 013 is located on a side, away from the first panel part 0111, of the second panel part 0112 and electrically connected with the display panel 011. The flexible circuit board 014 is located on the back surface of the first panel part 0111 and electrically connected with an end, away from the bent panel part 0113, of the second panel part 0112. As shown in FIG. 2, an orthographic projection of the driving circuit 013 on the first panel part 0111, an orthographic projection of the flexible circuit board 014 on the first panel part 0111, and an orthographic projection of the wave-absorbing layer 012 on the first panel part 0111 do not overlap.

In the embodiment of the present disclosure, the first panel part 0111 and the second panel part 0112 may be parallel to each other or the first panel part 0111 is substantially parallel to the second panel part 0112. For example, an angle between the first panel part 0111 and the second panel part 0112 is less than 5 degrees. The back surface of the first panel part 0111 may be a surface, close to the second panel part 0112, of the first panel part 0111.

Figure 3:
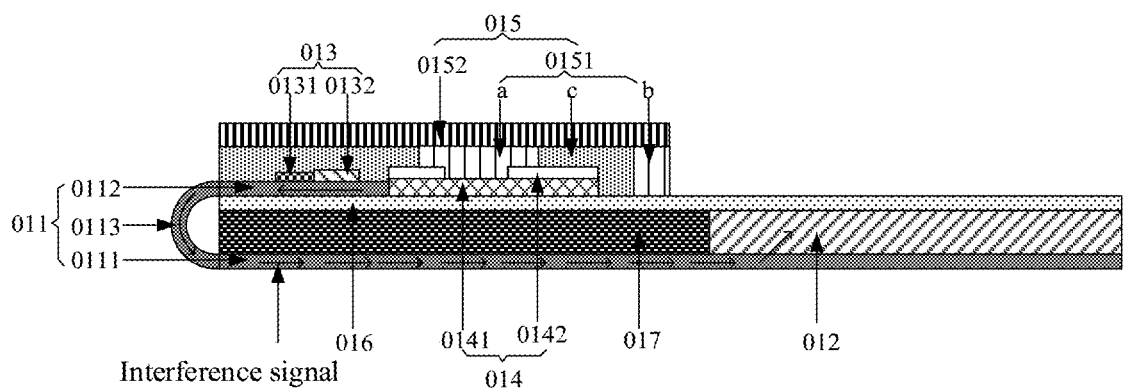
FIG. 3 is a schematic diagram showing the transmission of an interference signal along a display panel according to an embodiment of the present disclosure.

In the embodiment of the present disclosure, the minimum distance between the boundary of the wave-absorbing layer 012 and the middle frame antenna 02 is greater than or equal to 8 millimeters. Optionally, the minimum distance between the boundary of the wave-absorbing layer 012 and the middle frame antenna 02 is greater than or equal to 10 millimeters. The wave-absorbing layer 012 may be made of one or more of ferrite, magnetic iron nanomaterial, silicon carbide and a graphene polymer. It is well understood by a person skilled in the art that the driving circuit 013 generates an interference signal in an operation process and the interference signal will be transmitted along the display panel 011. In the embodiment of the present disclosure, when the interference signal is transmitted to a position where the wave-absorbing layer 012 is located, the wave-absorbing layer 012 may convert the interference signal into heat and then dissipate the same so as to absorb the interference signal. Therefore, the situation that the interference signal is transmitted to the middle frame antenna 02 to affect a signal of the middle frame antenna 02 is avoided. Exemplarily, please refer to FIG. 3 which shows a diagram illustrating the transmission of the interference signal along the display panel 011 according to the embodiment of the present disclosure. When the interference signal is transmitted along the display panel 011 to the position where the wave-absorbing layer 012 is located, the interference signal is absorbed by the wave-absorbing layer 012 and thus cannot be transmitted continuously.

Optionally, please continue to refer to FIGS. 1 and 2, the driving circuit 013 includes a multiplexer (MUX) 0131 and a display integrated circuit (IC) 0132. Both the MUX 0131 and display IC 0132 are located on a surface, away from the first panel part 0111, of the second panel part 0112. The display IC 0132 is electrically connected with the display panel 011 through the MUX 0131. In the embodiment of the present disclosure, the MUX 0131 may be a 1:n MUX. That is, each input port in the MUX 0131 corresponds to n output ports, and n is an integer greater than 1. Each input port of the MUX 0131 may be connected with one output port of the display IC 0132. Each output port of the MUX 0131 may be connected with a signal line (such as a data line) of the display panel 011. As such, for the same display integrated circuit, the use of the MUX enables the display IC to be connected with more signal wiring. Thus, the use of the MUX may achieve a smaller area of a fan-out region (i.e., a wiring region) of the display module.

Figure 4:
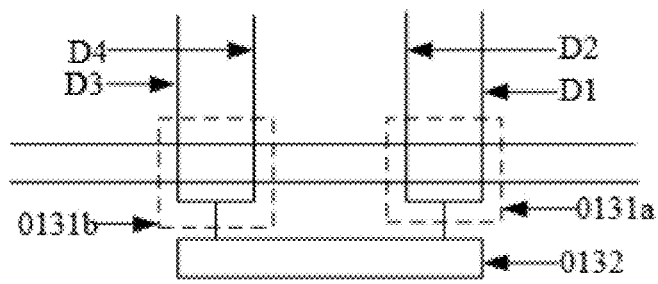
FIG. 4 is a diagram illustrating the connection of a MUX and a display IC according to an embodiment of the present disclosure.
Figure 5:
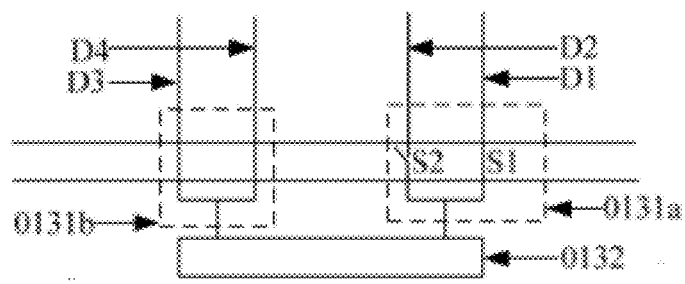
FIG. 5 is a routing diagram of a MUX according to an embodiment of the present disclosure.
Figure 6:
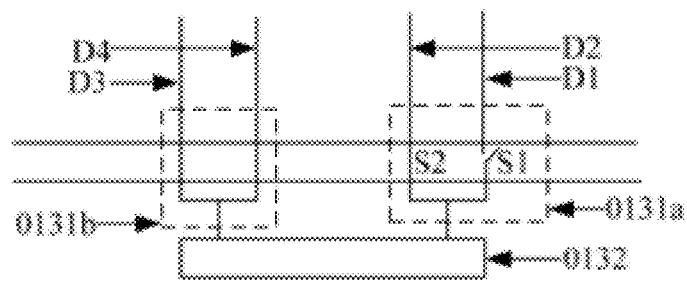
FIG. 6 is a routing diagram of another MUX according to an embodiment of the present disclosure.

Exemplarily, please refer to FIG. 4 which shows a diagram illustrating the connection of the MUX 0131 and the display IC 0132 according to the embodiment of the present disclosure. In FIG. 4, the description is given with an example that the display IC 0132 is connected with two MUXs 0131 (including a MUX 0131a and a MUX 0131b) and each MUX is a 1:2 MUX. As shown in FIG. 4, two output ports (not labeled in FIG. 4) of the display IC 0132 are connected with input ports (not labeled in FIG. 4) of the two MUXs in a one-to-one correspondence. Each input port of the MUX 0131a corresponds to two output ports. The two output ports of the MUX 0131a are connected with signal wiring D1 and signal wiring D2 in a one-to-one correspondence. Each input port of the MUX 0131b corresponds to two output ports. The two output ports of the MUX 0131b are connected with signal wiring D3 and signal wiring D4 in a one-to-one correspondence. Each output port of the MUX has a switch unit (not labeled in FIG. 4) and the MUX achieves the data routing through the switch unit. Exemplarily, please refer to FIG. 5 which shows a routing diagram of the MUX 0131a shown in FIG. 4. When the switch unit S1 is switched on and the switch unit S2 is switched off, the MUX 0131a causes the display IC 0132 to be electrically connected with the signal wiring D1, and the display IC 0132 to be disconnected from the signal wiring D2. Thus, the MUX 0131a selects the signal wiring D1 as a route for the display IC 0132. Exemplarily again, please refer to FIG. 6 which shows a routing diagram of another MUX 0131a shown in FIG. 4. When the switch unit S1 is switched off and the switch unit S2 is switched on, the MUX 0131a causes the display IC 0132 to be electrically connected with the signal wiring D2, and the display IC 0132 to be disconnected from the signal wiring D1. Thus, the MUX 0131a selects the signal wiring D2 as a route for the display IC 0132. It is well understood by a person skilled in the art that in the embodiment of the present disclosure, the description is given by taking the MUX 0131a, which performs routing, as an example. The routing principles of the MUX 0131b and other MUXs in the display module are similar to that of the MUX 0131a and thus will not be repeated in the embodiment of the present disclosure.

Optionally, please continue to refer to FIG. 2, the display module 01 further includes a shielding film 015 located on a side, away from the first panel part 0111 of the driving circuit 013. An orthographic projection of the shielding film 015 on the first panel part 0111 covers the orthographic projection of the driving circuit 013 on the first panel part 0111 and the orthographic projection of the flexible circuit board 014 on the first panel part 0111, and the orthographic projection of the shielding film 015 on the first panel part 0111 does not overlap with the orthographic projection of the wave-absorbing layer 012 on the first panel part 0111. The shielding film 015 may shield the interference signal generated by the driving circuit 013, thereby avoiding the situation that the interference signal is transmitted to the middle frame antenna 02 to affect the signal of the middle frame antenna 02. As shown in FIG. 2, the shielding film 015 may include an adhesive layer 0151 and a shielding layer 0152 which are stacked. The shielding film 015 is adhered to the side, away from the first panel part 0111, of the driving circuit 013 through the adhesive layer 0151. Optionally, the adhesive layer 0151 may include a first conductive portion a, a second conductive portion b and an insulating portion c except the first conductive portion a and the second conductive portion b. The first conductive portion a is electrically connected with the second conductive portion b (not shown in FIG. 2). The shielding layer 0152 may include one or more of a conductive fabric, copper foil and aluminum foil. For example, the shielding layer 0152 is a conductive fabric.

Optionally, please continue to refer to FIG. 2, the display module 01 further includes a heat-dissipating film 016 located between the first panel part 0111 and the second panel part 0112, and between the first panel part 0111 and the flexible circuit board 014 and part of the heat-dissipating film 016 is in contact with the second panel part 0112 and the flexible circuit board 014. The heat-dissipating film 016 may be made of metal. For example, the heat-dissipating film 016 is copper foil. In an operation process of the display module 01, the driving circuit 013 and the flexible circuit board 014 likely generate heat. As the heat-dissipating film 016 is in contact with the second panel part 0112, the heat generated by the driving circuit 013 may be transferred to the heat-dissipating film 016 through the second panel part 0112 and then is dissipated from the display module 01 by the heat-dissipating film 016. The heat generated by the flexible circuit board 014 may be directly transferred to the heat-dissipating film 016 and then is dissipated from the display module 01 by the heat-dissipating film 016. Therefore, the heat-dissipating film 016 may effectively dissipate the heat generated by the display module 01.

Optionally, please continue to refer to FIG. 2, the display module 01 further includes a buffer layer 017 located between the heat-dissipating film 016 and the first panel part 0111 and distributed on the same layer as the wave-absorbing layer 012. The buffer layer 017 may be a foam layer. The buffer layer 017 may buffer the heat-dissipating film 016 and other structures to reduce stress of the heat-dissipating film 016 and other structures.

Optionally, in the embodiment of the present disclosure, the flexible circuit board 014 may have two ends. One end (not labeled in both FIGS. 1 and 2) of the flexible circuit board 014 is electrically connected with an end, away from the bent panel part 0113, of the second panel part 0112 and the other end E (as shown in FIG. 1, but not shown in FIG. 2) thereof is configured to be electrically connected with a client mainboard (not shown in both FIGS. 1 and 2). As shown in FIG. 2, the flexible circuit board 014 includes a conductive layer 0141 and an insulating layer 0142 which are stacked. The conductive layer 0141 may be a copper layer. The insulating layer 0142 has an opening (not labeled in both FIGS. 1 and 2) and part of the conductive layer 0141 is exposed through the opening. In the shielding film 015, the adhesive layer 0151 includes the first conductive portion a, the second conductive portion b and the insulating portion c except the first conductive portion a and the second conductive portion b. The first conductive portion a is electrically connected with the second conductive portion b (not shown in FIG. 2). An orthographic projection of the first conductive portion a on the first panel part 0111 overlaps with an orthographic projection of the opening of the flexible circuit board 014 on the first panel part 0111, and an orthographic projection of the second conductive portion b on the first panel part 0111 overlaps with a portion, not in contact with the flexible circuit board 014 and the second panel part 0112, of the heat-dissipating film 016. The shielding film 015 is electrically connected with the flexible circuit board 014 through the first conductive portion a and electrically connected with the heat-dissipating film 016 through the second conductive portion b, and the shielding film 015 is grounded. In the embodiment of the present disclosure, the orthographic projection of the first conductive portion a on the first panel part 0111 may cover the orthographic projection of the opening of the flexible circuit board 014 on the first panel part 0111. As such, it is convenient for a sufficient contact between the first conductive portion a and the conductive layer 0141 and thus ensuring the effective connection of the shielding film 016 with the flexible circuit board 014.

In the embodiment of the present disclosure, the middle frame antenna 02 may be configured to emit and receive an electromagnetic wave signal and may have different forms. In the embodiment of the present disclosure, the description is given by taking the middle frame antenna 02 of three different forms as an example.

Middle frame antenna of a first form: exemplarily, please refer to FIG. 1, the middle frame antenna 02 includes an upper antenna 021, a lower antenna 022 and a side antenna 023. The upper antenna 021 and the lower antenna 022 may adopt the same structure. The upper antenna 021 may be of a U-shaped structure. The upper antenna 021 includes a bottom edge 0211 and two side edges 0212 located at two ends of the bottom edge 0211. The upper antenna 021 is located at the top of the display module 01. The bottom edge 0211 of the upper antenna 021 extends along a top edge (not labeled in FIG. 0.1) of the display module 01 and the two side edges 0212 of the upper antenna 021 extend along two side edges (not labeled in FIG. 0.1) of the display module 01. The lower antenna 022 may be of a U-shaped structure. The lower antenna 022 includes a bottom edge 0221 and two side edges 0222 located at two ends of the bottom edge 0221. The lower antenna 022 is located at the bottom of the display module 01. A bottom edge 0221 of the lower antenna 022 extends along a bottom edge (not labeled in FIG. 0.1) of the display module 01 and two side edges 0222 of the lower antenna 022 extend along two side edges (not labeled in FIG. 0.1) of the display module 01. The side antenna 023 may be of a linear structure. The side antenna 023 extends along a side edge of the display module 01 and is located between the upper antenna 021 and the lower antenna 022. A minimum distance d1 between the boundary of the wave-absorbing layer 012 and the upper antenna 021 and a minimum distance d3 between the boundary of the wave-absorbing layer 012 and the side antenna 023 may be greater than or equal to 8 millimeters. The minimum distance d1 between the boundary of the wave-absorbing layer 012 and the upper antenna 021 is equal to the minimum distance d3 between the boundary of the wave-absorbing layer 012 and the side antenna 023. A minimum distance d2 between the boundary of the wave-absorbing layer 012 and the lower antenna 022 may be greater than 8 millimeters.

Figure 7:
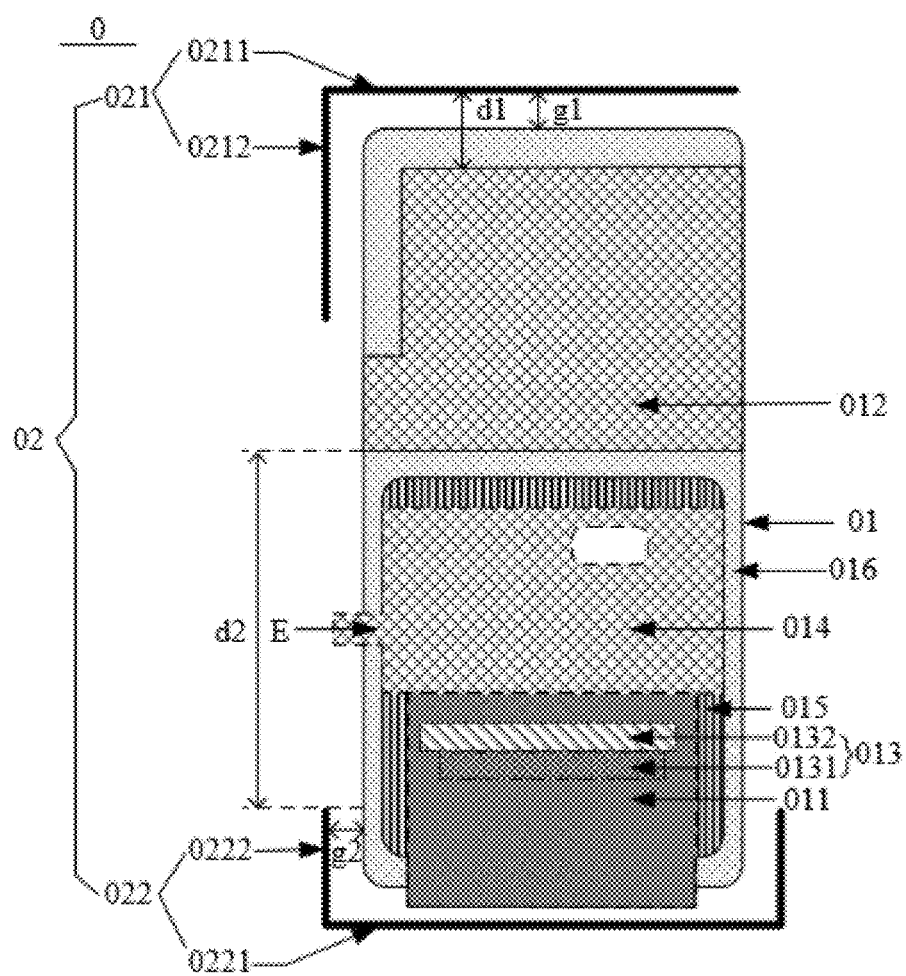
FIG. 7 is a front view structural schematic diagram of another display device according to an embodiment of the present disclosure.

Middle frame antenna of a second form: exemplarily, please refer to FIG. 7 which shows a front view structural schematic diagram of another display device 0 according to an embodiment of the present disclosure. As shown in FIG. 7, the middle frame antenna 02 may include an upper antenna 021 and a lower antenna 022. The upper antenna 021 may be of an L-shaped structure and includes a first edge 0211 and a second edge 0212. The first edge 0211 has a length greater than that of the second edge 0212. The upper antenna 021 is located at the top of the display module 01, the first edge 0211 extends along a top edge (not labeled in FIG. 7) of the display module 01 and the second edge 0212 extends along one side edge (not labeled in FIG. 7) of the display module 01. The lower antenna 022 may be of a U-shaped structure. The lower antenna 022 includes a bottom edge 0221 and two side edges 0222 located at two ends of the bottom edge 0221. The lower antenna 022 is located at the bottom of the display module 01. The bottom edge 0221 of the lower antenna 022 extends along a bottom edge (not labeled in FIG. 0.7) of the display module 01 and the two side edges 0222 of the lower antenna 022 extend along two side edges (not labeled in FIG. 0.7) of the display module 01. The wave-absorbing layer 012 may be L-shaped. A minimum distance d1 between the boundary of the wave-absorbing layer 012 and the upper antenna 021 may be greater than or equal to 8 millimeters, and a minimum distance d2 between the boundary of the wave-absorbing layer 012 and the lower antenna 022 may be greater than 8 millimeters.

Figure 8:
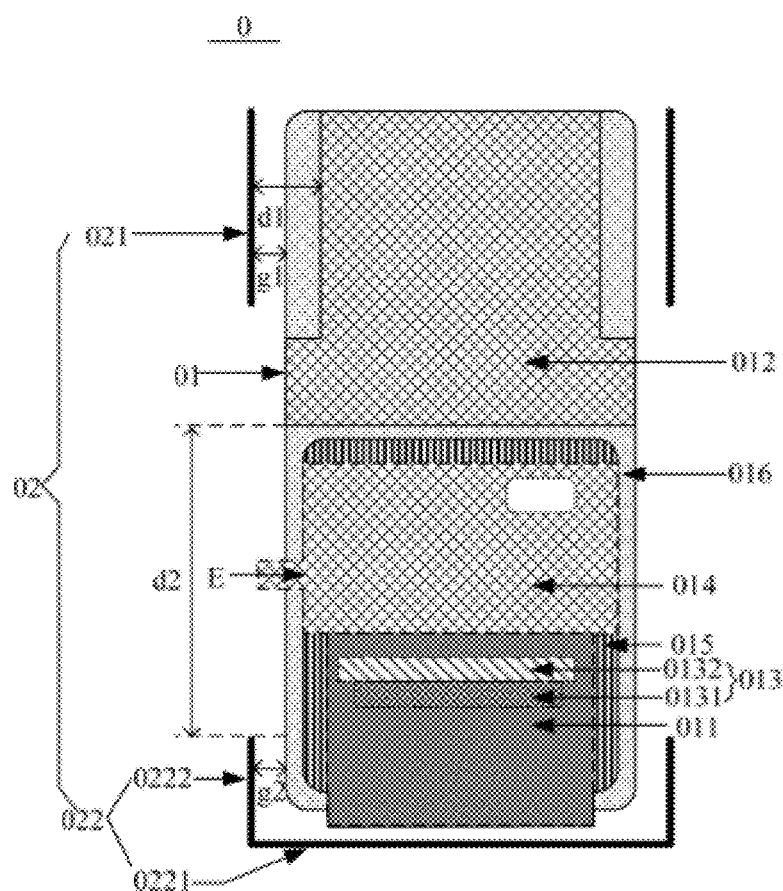
FIG. 8 is a front view structural schematic diagram of a further display device according to an embodiment of the present disclosure.

Middle frame antenna of a third form: exemplarily, please refer to FIG. 8 which shows a front view structural schematic diagram of a further display device 0 according to an embodiment of the present disclosure. As shown in FIG. 8, the middle frame antenna 02 may include two upper antennas 021 and a lower antenna 022. The upper antenna 021 may be of a linear structure. The two upper antennas 021 are located at the top of the display module 01 and extend along two side edges (not labeled in FIG. 8) of the display module 01 respectively. The lower antenna 022 may be of a U-shaped structure. The lower antenna 022 includes a bottom edge 0221 and two side edges 0222 located at two ends of the bottom edge 0221. The lower antenna 022 is located at the bottom of the display module 01. The bottom edge 0221 of the lower antenna 022 extends along a bottom edge (not labeled in FIG. 0.8) of the display module 01 and the two side edges 0222 of the lower antenna 022 extend along the two side edges (not labeled in FIG. 0.8) of the display module 01. The wave-absorbing layer 012 may be T-shaped. A minimum distance d1 between the boundary of the wave-absorbing layer 012 and the upper antenna 021 may be greater than or equal to 8 millimeters, and a minimum distance d2 between the boundary of the wave-absorbing layer 012 and the lower antenna 022 may be greater than 8 millimeters.

It should be noted that the middle frame antenna 02 of the above three forms described in the embodiment of the present disclosure is merely illustrative. It is well understood by a person skilled in the art that the form of the middle frame antenna is not limited to the above three forms and may be adjusted and changed according to actual needs, which is not limited in the embodiment of the present disclosure.

Optionally, in the embodiment of the present disclosure, a minimum distance between an end point of the middle frame antenna 02 and an end point of the wave-absorbing layer 012 may be greater than or equal to 10 millimeters. The wave-absorbing layer 012 may be polygonal and the end point of the wave-absorbing layer 012 may be a point where a corner of the wave-absorbing layer 012 is located, which is not limited in the embodiment of the present disclosure.

Optionally, in the embodiment of the present disclosure, a distance between the middle frame antenna 02 and an edge of the display module 01 is approximately 0.5 millimeter. For example, as shown in FIGS. 1, 7 and 8, both a distance g1 between the upper antenna 021 and the edge of the display module 01 and a distance g2 between the lower antenna 022 and the edge of the display module 01 are approximately 0.5 millimeter. As shown in FIG. 1, a distance g3 between the side antenna 023 and the edge of the display module 01 is approximately 0.5 millimeter. The distance between the middle frame antenna 02 and the edge of the display module 01 being approximately 0.5 millimeter may mean that a difference between the distance between the middle frame antenna 02 and the edge of the display module 01 and 0.5 millimeter is less than a preset threshold. The preset threshold is, for example, 0.2 millimeter, 0.1 millimeter or the like. Exemplarily, the distance between the middle frame antenna 02 and the edge of the display module 01 is 0.51 millimeter, 0.52 millimeter, 0.49 millimeter, 0.48 millimeter or the like, which is not limited in the embodiment of the present disclosure.

Optionally, in the embodiment of the present disclosure, the display device 0 may be a mobile terminal. For example, the display device 0 may be a mobile terminal such as a smart phone, a tablet computer or the like.

It is well understood by a person skilled in the art that to facilitate viewing by readers, FIGS. 1, 7 and 8 show structures (such as the wave-absorbing layer and other structures) below the uppermost layer (such as the shielding layer) in dashed line, but do not represent an actual hierarchical relationship of various structures in the display module. The actual hierarchical relationship of various structures in the display module should be based on a hierarchical relationship in a sectional view (such as FIG. 3) and will not be repeated in the embodiment of the present disclosure.

In summary, for the display device according to the embodiment of the present disclosure, the display device includes the display module and the middle frame antenna. The display module includes the wave-absorbing layer and the driving circuit and the wave-absorbing layer may absorb the interference signal generated by the driving circuit. Therefore, the influence of the interference signal on a display signal of the display device can be decreased. In addition, as the minimum distance between the boundary of the wave-absorbing layer and the middle frame antenna is greater than or equal to 8 millimeters, the wave-absorbing layer can be avoided from interfering with a signal of the middle frame antenna. Further, the display module further includes the shielding film and the shielding film may shield the interference signal generated by the driving circuit. Thus the influence of the interference signal on a display signal of the display module is decreased.

Figure 9:
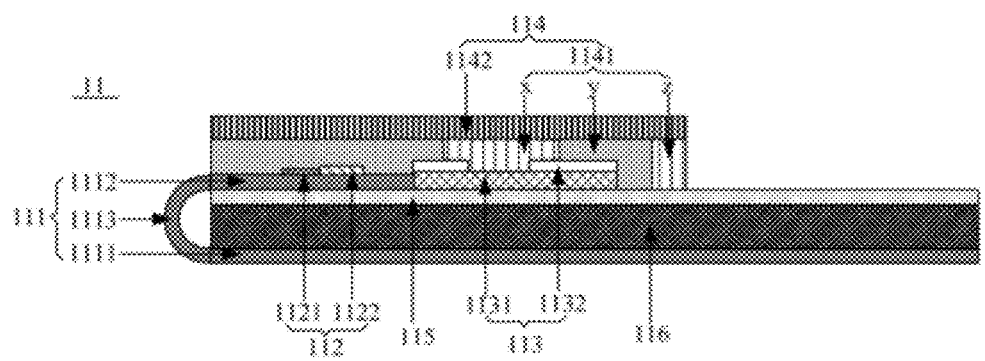
FIG. 9 is a sectional view structural schematic drawing of another display module according to an embodiment of the present disclosure.

Please refer to FIG. 9 which shows a sectional structural view of another display module 11 according to an embodiment of the present disclosure. Please refer to FIG. 9, the display module 11 includes a display panel 111, a driving circuit 112, a flexible circuit board 113 and a shielding film 114. The display panel 111 includes a first panel part 1111, a second panel part 1112, and a bent panel part 1113 connecting the first panel part 1111 and the second panel part 1112. The second panel part 1112 is located on a back surface of the first panel part 1111. The first panel part 1111 and the second panel part 1112 may be parallel to each other or the first panel part 1111 is substantially parallel to the second panel part 1112. For example, an angle between the first panel part 1111 and the second panel part 1112 is less than 5 degrees. The back surface of the first panel part 1111 may be a surface, close to the second panel part 1112, of the first panel part 1111. The driving circuit 112 is located on a side, away from the first panel part 1111, of the second panel part 1112 and electrically connected with the display panel 111. The flexible circuit board 113 is located on the back surface of the first panel part 1111 and electrically connected with an end, away from the bent panel part 1113, of the second panel part 1112. The shielding film 114 is located on a side, away from the first panel part 1111, of the driving circuit 112. An orthographic projection of the shielding film 114 on the first panel part 1111 covers an orthographic projection of the driving circuit 112 on the first panel part 1111 and an orthographic projection of the flexible circuit board 113 on the first panel part 1111.

As shown in FIG. 9, the driving circuit 112 includes a MUX 1121 and a display IC 1122, both of which are located on a surface, away from the first panel part 1111, of the second panel part 1112. The display IC 1122 is electrically connected with the display panel 111 through the MUX 1121. A connection relationship between the MUX 1121 and the display IC 1122 and the routing principle of the MUX 1121 may refer to the foregoing display device embodiment, and will not be repeated in the embodiment of the present disclosure here.

As shown in FIG. 9, the flexible circuit board 113 may have two ends. One end (not labeled in FIG. 9) of the flexible circuit board 113 is electrically connected with an end, away from the bent panel part 1113, of the second panel part 1112 and the other end E (not shown in FIG. 9) thereof is configured to be electrically connected with a client mainboard (not shown in FIG. 9). As shown in FIG. 9, the flexible circuit board 113 includes a conductive layer 1131 and an insulating layer 1132 which are stacked. The conductive layer 1131 may be a copper layer. The insulating layer 1132 has an opening (not labeled in FIG. 9) and part of the conductive layer 1131 is exposed through the opening. The shielding film 114 may include an adhesive layer 1141 and a shielding layer 1142 which are stacked. The shielding film 114 is adhered to the side, away from the first panel part 1111, of the driving circuit 112 through the adhesive layer 1141. The shielding layer 1142 includes one or more of a conductive fabric, copper foil and aluminum foil. The adhesive layer 1141 includes a first conductive portion x and an insulating partition y. An orthographic projection of the first conductive portion x on the first panel part 1111 overlaps with an orthographic projection of the opening of the flexible circuit board 113 on the first panel part 1111. The shielding film 114 is grounded. In the embodiment of the present disclosure, the orthographic projection of the first conductive portion x on the first panel part 1111 may cover the orthographic projection of the opening of the flexible circuit board 113 on the first panel part 1111. As such, it is convenient for a sufficient contact of the first conductive portion x with the conductive layer 1131 and thus ensuring the effective connection of the shielding film 114 with the flexible circuit board 113.

Optionally, please continue to refer to FIG. 9, the display module 11 further includes a heat-dissipating film 115 located between the first panel part 1111 and the second panel part 1112 and between the first panel part 1111 and the flexible circuit board 113, and part of the heat-dissipating film 115 is in contact with the second panel part 1112 and the flexible circuit board 113. In the shielding film 114, the adhesive layer 1141 further includes a second conductive portion z. The first conductive portion x is electrically connected with the second conductive portion z (not shown in FIG. 9). An orthographic projection of the second conductive portion z on the first panel part 1111 overlaps with a portion, not in contact with the flexible circuit board 113 and the second panel part 1112, of the heat-dissipating film 115. The shielding film 114 is electrically connected with the heat-dissipating film 115 through the second conductive portion z. The heat-dissipating film 115 may be made of metal. For example, the heat-dissipating film 115 is copper foil. In an operation process of the display module 11, the driving circuit 112 and the flexible circuit board 113 likely generate heat. As the heat-dissipating film 115 is in contact with the second panel part 1112, the heat generated by the driving circuit 112 may be transferred to the heat-dissipating film 115 through the second panel part 1112 and then is dissipated from the display module 11 by the heat-dissipating film 115. The heat generated by the flexible circuit board 113 may be directly transferred to the heat-dissipating film 115 and then is dissipated from the display module 11 by the heat-dissipating film 115. Therefore, the heat-dissipating film 115 may effectively dissipate the heat generated by the display module 11.

Optionally, please continue to refer to FIG. 9, the display module 11 further includes a buffer layer 116 located between the heat-dissipating film 115 and the first panel part 1111. The buffer layer 116 may be a foam layer. The buffer layer 116 may buffer the heat-dissipating film 115 and other structures to reduce stress of the heat-dissipating film 115 and other structures.

In summary, for the display module according to the embodiment of the present disclosure, the display module includes the shielding film and the driving circuit, and the shielding film may shield the interference signal generated by the driving circuit. Thus, the influence of the interference signal on a display signal of the display module may be decreased.

Figure 10:
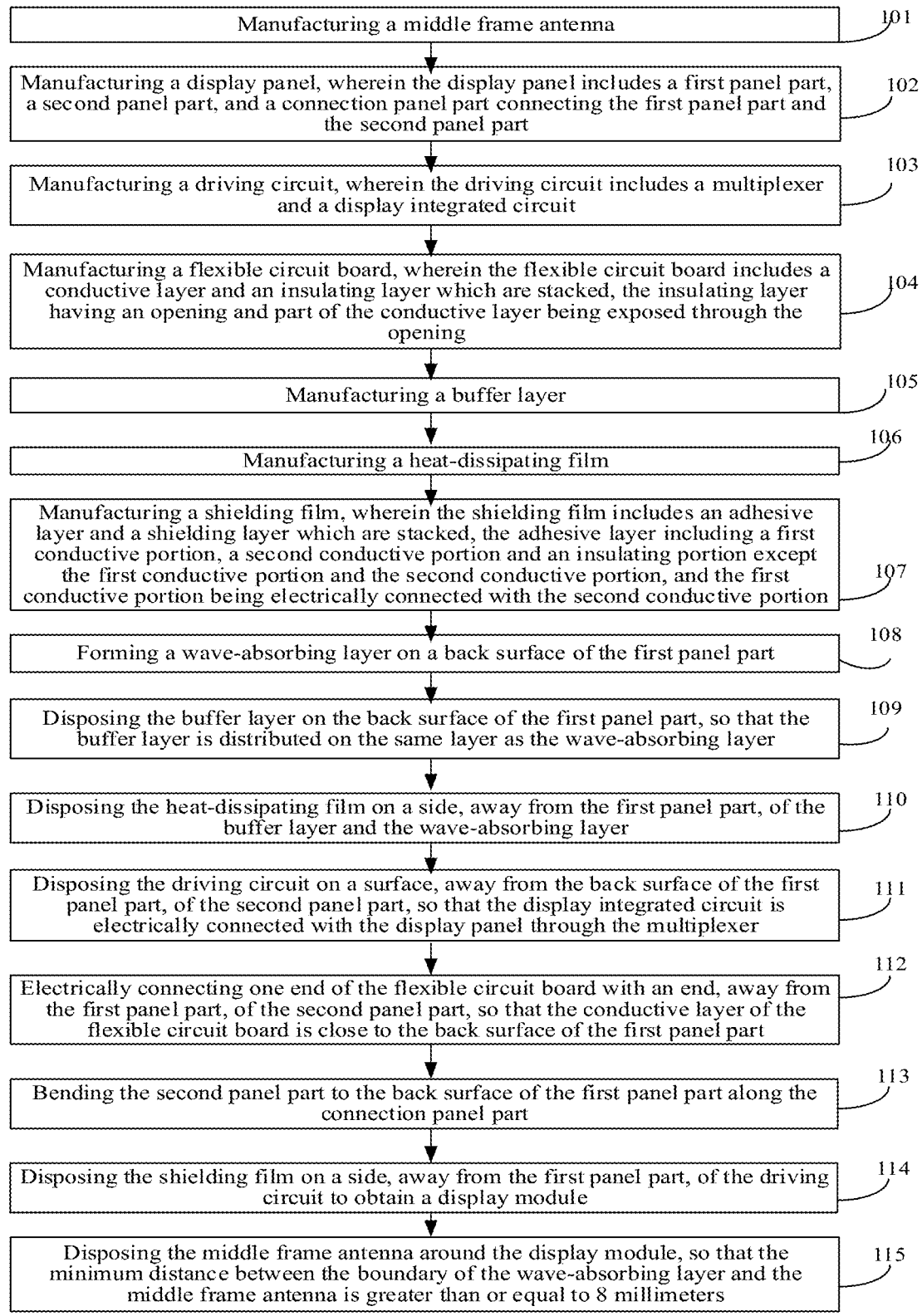
FIG. 10 is a method flow chart of a method for manufacturing a display device according to an embodiment of the present disclosure.

Please refer to FIG. 10 which shows a method flow chart of a method for manufacturing a display device according to an embodiment of the present disclosure. The method for manufacturing the display device may be applied to manufacture the display device 0 shown in FIG. 1, FIG. 7 or FIG. 8. Please refer to FIG. 10, the method includes the following steps.

In step 101, a middle frame antenna is manufactured.

In the embodiment of the present disclosure, the middle frame antenna may have different forms. For example, as shown in FIG. 1, the middle frame antenna 02 includes an upper antenna 021, a lower antenna 022 and a side antenna 023. The upper antenna 021 is of a U-shaped structure. The upper antenna 021 includes a bottom edge 0211 and two side edges 0212 located at two ends of the bottom edge. The lower antenna 022 is of a U-shaped structure. The lower antenna 022 includes a bottom edge 0221 and two side edges 0222 located at two ends of the bottom edge 0221. The side antenna 023 is of a linear structure. Or as shown in FIG. 7, the middle frame antenna 02 includes an upper antenna 021 and a lower antenna 022. The upper antenna 021 is of an L-shaped structure. The upper antenna 021 includes a first edge 0211 and a second edge 0212. The first edge 0211 has a length greater than that of the second edge 0212. The lower antenna 022 is of a U-shaped structure. The lower antenna 022 includes a bottom edge 0221 and two side edges 0222 located at two ends of the bottom edge. Or as shown in FIG. 8, the middle frame antenna 02 includes two upper antennas 021 and a lower antenna 022. The upper antenna 021 is of a linear structure. The lower antenna 022 is of a U-shaped structure. The lower antenna 022 includes a bottom edge 0221 and two side edges 0222 located at two ends of the bottom edge 0221.

The middle frame antenna may be made of metal material or alloy material. For example, the middle frame antenna may be made of aluminum alloy material. Optionally, the middle frame antenna may be manufactured by a metal forming process. Exemplarily, the middle frame antenna 02 shown in FIG. 1, FIG. 7 or FIG. 8 may be manufactured by the metal forming process.

In step 102, a display panel is manufactured, wherein the display panel includes a first panel part, a second panel part, and a connection panel part connecting the first panel part and the second panel part.

The display panel may be a flexible display panel, so that the display panel may be bent along the connection panel part. Thus, the second panel part is located on a back surface of the first panel part.

Optionally, the display panel may be an organic light-emitting diode (OLED) display panel or a quantum dot light-emitting diode (QLED) display panel.

In step 103, a driving circuit is manufactured, wherein the driving circuit includes a multiplexer and a display integrated circuit.

The multiplexer may be a 1:n MUX. That is, each input port in the MUX corresponds to n output ports, where n is an integer greater than 1. For example, the multiplexer may be a 1:2 MUX.

The display integrated circuit may be a display integrated IC. In the embodiment of the present disclosure, the multiplexer and the display integrated circuit may be manufactured by a circuit preparation process, so that the driving circuit is manufactured.

In step 104, a flexible circuit board is manufactured, wherein the flexible circuit board includes a conductive layer and an insulating layer which are stacked. The insulating layer has an opening and part of the conductive layer is exposed through the opening.

The conductive layer may be made of metal material or alloy material. For example, the conductive layer may be made of one of copper, aluminum and molybdenum or alloy material of at least two of copper, aluminum and molybdenum. The insulating layer may be made of one of $SiO_2$, SiOx, SiNx, $Al_2O_3$ and SiOxNx or a combination thereof.

Exemplarily, by taking the conductive layer being made of copper and the insulating layer being made of $SiO_2$ as an example, a metal copper material layer may be formed by any of processes such as sputtering and thermal evaporation, and then is processed by a one-time patterning process to obtain the conductive layer. Next, with $SiO_2$ as a material, a $SiO_2$ material layer is formed on the conductive layer by any of processes such as deposition, coating and sputtering and then is processed to obtain the insulating layer having the opening. Thus, the flexible circuit board is obtained.

In step 105, a buffer layer is manufactured.

Optionally, the buffer layer may be a foam layer.

In step 106, a heat-dissipating film is manufactured.

The heat-dissipating film may be made of metal. For example, the heat-dissipating film may be copper foil.

Optionally, the heat-dissipating film may be manufactured with metal copper as material by a film forming process.

In step 107, a shielding film is manufactured, wherein the shielding film includes an adhesive layer and a shielding layer which are stacked. The adhesive layer includes a first conductive portion, a second conductive portion and an insulating portion except the first conductive portion and the second conductive portion. The first conductive portion is electrically connected with the second conductive portion.

The shielding layer may include one or more of a conductive fabric, copper foil and aluminum foil. For example, the shielding layer is a conductive fabric. The adhesive layer includes a first conductive portion, a second conductive portion and an insulating portion except the first conductive portion and the second conductive portion. The first conductive portion is electrically connected with the second conductive portion.

Optionally, firstly, the first conductive portion and the second conductive portion may be formed on a base substrate by a conductive adhesive and the insulating portion is formed on the base substrate by an insulating adhesive, and the first conductive portion and the second conductive portion are electrically connected, thereby obtaining the adhesive layer. Next, one or more of the conductive fabric, copper foil and aluminum foil are formed on the adhesive layer to obtain the shielding layer. Finally, the base substrate is removed to obtain the shielding film.

In step 108, a wave-absorbing layer is formed on the back surface of the first panel part.

In the embodiment of the present disclosure, the shape of the wave-absorbing layer may vary according to different forms of the middle frame antenna. For example, as shown in FIG. 1, the wave-absorbing layer 012 is irregularly polygonal. Or as shown in FIG. 7, the wave-absorbing layer 012 is L-shaped. Or as shown in FIG. 8, the wave-absorbing layer 012 is T-shaped.

The wave-absorbing layer may be made of one or more of ferrite, magnetic iron nanomaterial, silicon carbide and a graphene polymer.

Optionally, a ferrite material layer may be formed on the back surface of the first panel part by any of processes such as deposition, coating and sputtering, and then is processed by the one-time patterning process to obtain the wave-absorbing layer. Exemplarily, the wave-absorbing layer 012 shown in FIG. 1, FIG. 7 or FIG. 8 is obtained by processing the ferrite material layer by the one-time patterning process.

In step 109, the buffer layer is disposed on the back surface of the first panel part, so that the buffer layer is distributed on the same layer as the wave-absorbing layer.

Optionally, the buffer layer may be adhered to the back surface of the first panel part with an optical adhesive, so that the buffer layer is distributed on the same layer as the wave-absorbing layer.

In step 110, the heat-dissipating film is disposed on a side, away from the first panel part, of the buffer layer and the wave-absorbing layer.

Optionally, the heat-dissipating film may be adhered to the side, away from the first panel part, of the buffer layer and the wave-absorbing layer with an optical adhesive. An orthographic projection of the heat-dissipating film on the first panel part covers an orthographic projection of the buffer layer on the first panel part and an orthographic projection of the wave-absorbing layer on the first panel part.

In step 111, the driving circuit is disposed on a surface, away from the back surface of the first panel part, of the second panel part, so that the display integrated circuit is electrically connected with the display panel through the multiplexer.

Optionally, the MUX may be electrically connected with the display panel and the display IC is electrically connected with the MUX, and then the display IC and the MUX are adhered to the surface, away from the back surface of the first panel part, of the second panel part. A connection relationship between the MUX and the display panel and a connection relationship between the display IC and the MUX may refer to FIGS. 4-6, and will not be repeated in the embodiment of the present disclosure here.

In step 112, one end of the flexible circuit board is electrically connected with an end, away from the first panel part, of the second panel part, so that the conductive layer of the flexible circuit board is close to the back surface of the first panel part.

Optionally, one end of the flexible circuit board and the end, away from the first panel part, of the second panel part may be both provided with a golden finger. One end of the flexible circuit board is bound to the end, away from the first panel part, of the second panel part through the golden fingers, so that the one end of the flexible circuit board is electrically connected with the end, away from the first panel part, of the second panel part and the conductive layer of the flexible circuit board is close to the back surface of the first panel part.

In step 113, the second panel part is bent to the back surface of the first panel part along the connection panel part.

Optionally, the second panel part may be bent to the back surface of the first panel part along the connection panel part. As a result, the driving circuit is located on a side, away from the first panel part, of the second panel part; the flexible circuit board is located on the back surface of the first panel part; the wave-absorbing layer and the buffer layer are located between the first panel part and the second panel part; the heat-dissipating film is located between the first panel part and the second panel part, and between the first panel part and the flexible circuit board, and part of the heat-dissipating film is in contact with the second panel part and the flexible circuit board; and an orthographic projection of the driving circuit on the first panel part, an orthographic projection of the flexible circuit board on the first panel part, and an orthographic projection of the wave-absorbing layer on the first panel part do not overlap.

In step 114, the shielding film is disposed on a side, away from the first panel part, of the driving circuit to obtain a display module.

Optionally, the shielding film may be adhered to the side, away from the first panel part, of the driving circuit through the adhesive layer of the shielding film by an adhering process. As a result, an orthographic projection of the first conductive portion of the adhesive layer in the shielding film on the first panel part overlaps with an orthographic projection of the opening of the flexible circuit board on the first panel part, and an orthographic projection of the second conductive portion on the first panel part overlaps with a portion, not in contact with the flexible circuit board and the second panel part, of the heat-dissipating film; the shielding film is electrically connected with the flexible circuit board through the first conductive portion and electrically connected with the heat-dissipating film through the second conductive portion, and the shielding film is grounded; and an orthographic projection of the shielding film on the first panel part covers an orthographic projection of the driving circuit on the first panel part and an orthographic projection of the flexible circuit board on the first panel part, and the orthographic projection of the shielding film on the first panel part does not overlap with the orthographic projection of the wave-absorbing layer on the first panel part.

In step 115, the middle frame antenna is disposed around the display module, so that a minimum distance between the boundary of the wave-absorbing layer and the middle frame antenna is greater than or equal to 8 millimeters.

Exemplarily, as show in FIG. 1, the middle frame antenna 02 may be disposed around the display module 01.

As a result, the upper antenna 021 is located at the top of the display module 01, the bottom edge 0211 of the upper antenna 021 extends along a top edge of the display module 01 and the two side edges 0212 of the upper antenna 021 extend along two side edges of the display module 01; the lower antenna 022 is located at the bottom of the display module 01, the bottom edge 0221 of the lower antenna 022 extends along a bottom edge of the display module 01 and the two side edges 0222 of the lower antenna 022 extend along two side edges of the display module 01; the side antenna 023 extends along the side edge of the display module 01 and located between the upper antenna 021 and the lower antenna 022; a minimum distance d1 between the boundary of the wave-absorbing layer 012 and the upper antenna 021 and a minimum distance d3 between the boundary of the wave-absorbing layer 012 and the side antenna 023 may be greater than or equal to 8 millimeters; the minimum distance d1 between the boundary of the wave-absorbing layer 012 and the upper antenna 021 is equal to the minimum distance d3 between the boundary of the wave-absorbing layer 012 and the side antenna 023; and a minimum distance d2 between the boundary of the wave-absorbing layer 012 and the lower antenna 022 may be greater than 8 millimeters.

Exemplarily, as shown in FIG. 7, the middle frame antenna 02 may be disposed around the display module 01. As a result, the upper antenna 021 is located at the top of the display module 01, the first edge 0211 of the upper antenna 021 extends along a top edge of the display module 01 and the second edge 0212 extends along one side edge of the display module 01; the lower antenna 022 is located at the bottom of the display module 01, the bottom edge 0221 of the lower antenna 022 extends along a bottom edge of the display module 01 and the two side edges 0222 of the lower antenna 022 extend along two side edges of the display module 01; a minimum distance d1 between the boundary of the wave-absorbing layer 012 and the upper antenna 021 may be greater than or equal to 8 millimeters; and a minimum distance d2 between the boundary of the wave-absorbing layer 012 and the lower antenna 022 may be greater than 8 millimeters.

Exemplarily, as shown in FIG. 8, the middle frame antenna 02 may be disposed around the display module 01. As a result, the two upper antennas 021 are located at the top of the display module 01 and extend along two side edges of the display module 01 respectively; the lower antenna 022 is located at the bottom of the display module 01, the bottom edge 0221 of the lower antenna 022 extends along a bottom edge of the display module 01 and the two side edges 0222 of the lower antenna 022 extend along two side edges of the display module 01; a minimum distance d1 between the boundary of the wave-absorbing layer 012 and the upper antenna 021 may be greater than or equal to 8 millimeters; and a minimum distance d2 between the boundary of the wave-absorbing layer 012 and the lower antenna 022 may be greater than 8 millimeters.

It should be noted that in the above process of disposing the middle frame antenna, it is possible to set a distance between the middle frame antenna and an edge of the display module to be approximately 0.5 millimeter. For example, the distance between the middle frame antenna and the edge of the display module is 0.51 millimeter, 0.52 millimeter, 0.49 millimeter, 0.48 millimeter or the like, which is not limited in the embodiment of the present disclosure.

In summary, for the method for manufacturing the display device according to the embodiment of the present disclosure, the display device manufactured by the method for manufacturing the display device includes the display module and the middle frame antenna. The display module includes the wave-absorbing layer and the driving circuit and the wave-absorbing layer may absorb the interference signal generated by the driving circuit. Therefore, the influence of the interference signal on a display signal of the display device can be decreased. In addition, as the minimum distance between the boundary of the wave-absorbing layer and the middle frame antenna is greater than or equal to 8 millimeters, the wave-absorbing layer can be avoided from interfering with a signal of the middle frame antenna. Further, the display module further includes the shielding film and the shielding film may shield the interference signal generated by the driving circuit. Thus, the influence of the interference signal on the display signal of the display module is decreased.

In the manufacturing method of the display device according to the embodiment of the present disclosure, the involved one-time patterning process includes photoresist coating, exposure, development, etching and photoresist stripping. The processing of a material layer (such as a metal copper material layer) by the one-time patterning process includes: firstly, coating the material layer (such as the metal copper material layer) with a layer of photoresist to form a photoresist layer; next, exposing the photoresist layer with a mask, so that the photoresist layer forms a completely-exposed region and a non-exposed region; subsequently, adopting a developing process for processing, so that the photoresist in the completely-exposed region is completely removed, and all the photoresist in the non-exposed region is retained; hereafter, etching a region, corresponding to the completely-exposed region, on the material layer (such as the metal copper material layer) by an etching process; and stripping the photoresist in the non-exposed region, so that a corresponding structure (such as the conductive layer) is obtained. Here, the description is given by taking the photoresist as a positive photoresist. When the photoresist is a negative photoresist, the process of the one-time patterning process may refer to the description in this paragraph and will not be repeated in the embodiment of the present disclosure here.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A display device, comprising:
   a display module and a middle frame antenna located around the display module, wherein
   the display module comprises:
   a display panel, wherein the display panel comprises a first panel part, a second panel part and a bent panel part connecting the first panel part and the second panel part, and the second panel part is located on a back surface of the first panel part;
   a wave-absorbing layer, wherein the wave-absorbing layer is located between the first panel part and the second panel part, and a minimum distance between a boundary of the wave-absorbing layer and the middle frame antenna is greater than or equal to 8 millimeters;
   a driving circuit located on a side, away from the first panel part, of the second panel part and electrically connected with the display panel; and
   a flexible circuit board located on the back surface of the first panel part and electrically connected with an end, away from the bent panel part, of the second panel part, and
   wherein an orthographic projection of the driving circuit on the first panel part, an orthographic projection of the flexible circuit board on the first panel part and an orthographic projection of the wave-absorbing layer on the first panel part do not overlap.

2. The display device according to claim 1, wherein
   the driving circuit comprises a multiplexer and a display integrated circuit, both the multiplexer and the display integrated circuit are located on a surface, away from the first panel part, of the second panel part, and the display integrated circuit is electrically connected with the display panel through the multiplexer.

3. The display device according to claim 1, wherein
   the display module further comprises a shielding film located on a side, away from the first panel part, of the driving circuit;
   an orthographic projection of the shielding film on the first panel part covers the orthographic projection of the driving circuit on the first panel part and the orthographic projection of the flexible circuit board on the first panel part; and
   the orthographic projection of the shielding film on the first panel part does not overlap with the orthographic projection of the wave-absorbing layer on the first panel part.

4. The display device according to claim 3, wherein
   the shielding film comprises an adhesive layer and a shielding layer which are stacked; and the shielding film is adhered to the side, away from the first panel part, of the driving circuit through the adhesive layer.

5. The display device according to claim 4, wherein
   the shielding layer comprises one or more of a conductive fabric, copper foil and aluminum foil.

6. The display device according to claim 4, wherein
   the display module further comprises a heat-dissipating film located between the first panel part and the second panel part, and between the first panel part and the flexible circuit board, and part of the heat-dissipating film is in contact with the second panel part and the flexible circuit board.

7. The display device according to claim 6, wherein the heat-dissipating film is made of metal.

8. The display device according to claim 6, wherein
   one end of the flexible circuit board is electrically connected with the end, away from the bent panel part, of the second panel part and the other end is configured to be electrically connected with a client mainboard, the flexible circuit board comprises a conductive layer and an insulating layer which are stacked, and the insulating layer has an opening and part of the conductive layer is exposed through the opening;
   in the shielding film, the adhesive layer comprises a first conductive portion, a second conductive portion and an insulating portion except the first conductive portion and the second conductive portion, the first conductive portion is electrically connected with the second conductive portion, an orthographic projection of the first conductive portion on the first panel part overlaps with an orthographic projection of the opening on the first panel part, and an orthographic projection of the second conductive portion on the first panel part overlaps with a portion, not in contact with the flexible circuit board and the second panel part, of the heat-dissipating film; and the shielding film is electrically connected with the flexible circuit board through the first conductive portion and electrically connected with the heat-dissipating film through the second conductive portion, and the shielding film is grounded.

9. The display device according to claim 6, wherein the display module further comprises a buffer layer located between the heat-dissipating film and the first panel part and distributed on the same layer as the wave-absorbing layer.

10. The display device according to claim 9, wherein the buffer layer is a foam layer.

11. The display device according to claim 1, wherein the minimum distance between the boundary of the wave-absorbing layer and the middle frame antenna is greater than or equal to 10 millimeters.

12. The display device according to claim 1, wherein the wave-absorbing layer is made of one or more of ferrite, magnetic iron nanomaterial, silicon carbide and a graphene polymer.

13. The display device according to claim 1, wherein a minimum distance between an end point of the middle frame antenna and an end point of the wave-absorbing layer is greater than or equal to 10 millimeters.

14. The display device according to claim 1, wherein a distance between the middle frame antenna and an edge of the display module is approximately 0.5 millimeter.

15. The display device according to claim 1, wherein the middle frame antenna comprises an upper antenna, a lower antenna and a side antenna, and a structure of the upper antenna is the same as that of the lower antenna;

the upper antenna is of a U-shaped structure and comprises a bottom edge and two side edges located at two ends of the bottom edge;

the upper antenna is located at a top of the display module, the bottom edge of the upper antenna extends along a top edge of the display module and the two side edges of the upper antenna extend along two side edges of the display module;

the lower antenna is located at a bottom of the display module, a bottom edge of the lower antenna extends along a bottom edge of the display module and two side edges of the lower antenna extend along the two side edges of the display module;

the side antenna is of a linear structure, extends along the side edge of the display module and is located between the upper antenna and the lower antenna; and a minimum distance between the boundary of the wave-absorbing layer and the upper antenna and a minimum distance between the boundary of the wave-absorbing layer and the side antenna are greater than or equal to 8 millimeters, and a minimum distance between the boundary of the wave-absorbing layer and the lower antenna is greater than 8 millimeters.

16. The display device according to claim 15, wherein the minimum distance between the boundary of the wave-absorbing layer and the upper antenna is equal to the minimum distance between the boundary of the wave-absorbing layer and the side antenna.

17. The display device according to claim 1, wherein the middle frame antenna comprises an upper antenna and a lower antenna, the upper antenna is of an L-shaped structure, comprises a first edge and a second edge, and a length of the first edge is greater than that of the second edge;

the lower antenna is of a U-shaped structure and comprises a bottom edge and two side edges located at two ends of the bottom edge;

the upper antenna is located at a top of the display module, the first edge extends along a top edge of the display module and the second edge extends along one side edge of the display module;

the lower antenna is located at a bottom of the display module, a bottom edge of the lower antenna extends along a bottom edge of the display module and two side edges of the lower antenna extend along two side edges of the display module; and the wave-absorbing layer is L-shaped, a minimum distance between the boundary of the wave-absorbing layer and the upper antenna is greater than or equal to 8 millimeters, and a minimum distance between the boundary of the wave-absorbing layer and the lower antenna is greater than 8 millimeters.

18. The display device according to claim 1, wherein the middle frame antenna comprises a lower antenna and two upper antennas;

the upper antenna is of a linear structure;

the lower antenna is of a U-shaped structure and comprises a bottom edge and two side edges located at two ends of the bottom edge;

the two upper antennas are located at a top of the display module and extend along two side edges of the display module respectively;

the lower antenna is located at a bottom of the display module, a bottom edge of the lower antenna extends along a bottom edge of the display module and two side edges of the lower antenna extend along the two side edges of the display module; and the wave-absorbing layer is T-shaped, a minimum distance between the boundary of the wave-absorbing layer and the upper antenna is greater than or equal to 8 millimeters, and a minimum distance between the boundary of the wave-absorbing layer and the lower antenna is greater than 8 millimeters.

19. The display device according to claim 1, wherein the display device is a mobile terminal.

20. A display module, comprising:

a display panel, wherein the display panel comprises a first panel part, a second panel part and a bent panel part connecting the first panel part and the second panel part, and the second panel part is located on a back surface of the first panel part;

a driving circuit, wherein the driving circuit comprises a multiplexer and a display integrated circuit, both the multiplexer and the display integrated circuit are located on a surface, away from the first panel part, of the second panel part, and the display integrated circuit is electrically connected with the display panel through the multiplexer;

a flexible circuit board, wherein the flexible circuit board is located on the back surface of the first panel part and one end of the flexible circuit board is electrically connected with an end, away from the bent panel part, of the second panel part and the other end is configured to be electrically connected with a client mainboard; and a shielding film, wherein the shielding film comprises an adhesive layer and a shielding layer which are stacked, the shielding film is adhered to a side, away from the first panel part, of the driving circuit through the adhesive layer, and an orthographic projection of the shielding film on the first panel part covers an orthographic projection of the driving circuit on the first panel part and an orthographic projection of the flexible circuit board on the first panel part, wherein the flexible circuit board comprises a conductive layer and an insulating layer are stacked, the insulating layer has an opening, part of the conductive layer is exposed through the opening, the adhesive layer comprises a conductive portion and an insulating portion, an orthographic projection of the conductive layer on the first panel part overlapping with an orthographic projection of the opening on the first panel part, and the shielding film is grounded.

\* \* \* \* \*